US012513885B2

(12) United States Patent
Guo et al.

(10) Patent No.: US 12,513,885 B2
(45) Date of Patent: Dec. 30, 2025

(54) METHOD FOR FORMING SEMICONDUCTOR DEVICE AND SEMICONDUCTOR DEVICE

(71) Applicant: CHANGXIN MEMORY TECHNOLOGIES, INC., Hefei (CN)

(72) Inventors: Shuai Guo, Hefei (CN); Mingguang Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 813 days.

(21) Appl. No.: 17/807,853

(22) Filed: Jun. 20, 2022

(65) Prior Publication Data

US 2023/0225108 A1 Jul. 13, 2023

Related U.S. Application Data

(63) Continuation of application No. PCT/CN2022/081165, filed on Mar. 16, 2022.

(30) Foreign Application Priority Data

Jan. 7, 2022 (CN) .......................... 202210013802.0

(51) Int. Cl.
H10B 12/00 (2023.01)
(52) U.S. Cl.
CPC ............. *H10B 12/30* (2023.02); *H10B 12/03* (2023.02); *H10B 12/482* (2023.02)
(58) Field of Classification Search
CPC ...... H10B 12/30; H10B 12/03; H10B 12/482; H10B 12/488; H10D 62/115
See application file for complete search history.

(56) References Cited

U.S. PATENT DOCUMENTS 11,257,822 B2 2/2022 Gomes
2016/0181143 A1 6/2016 Kwon et al.
(Continued)

FOREIGN PATENT DOCUMENTS

CN 109786380 A 5/2019
CN 111435661 A 7/2020
(Continued)

OTHER PUBLICATIONS

First Office Action of the Chinese application No. 202210013802.0, issued on Feb. 16, 2022.
(Continued)

*Primary Examiner* — Herve-Louis Y Assouman
(74) *Attorney, Agent, or Firm* — Syncoda LLC; Feng Ma

(57) ABSTRACT

A method for forming a semiconductor device includes: providing a substrate and a stacked structure covering the substrate and including alternately stacked dielectric layers and sacrificial layers; forming multiple isolation layers extending in a first direction and arranged in a second direction in the stacked structure, the first direction being perpendicular to the substrate surface and the second direction being perpendicular to the first direction; forming a bit line between two adjacent ones of the isolation layers and removing the sacrificial layers; forming capacitor via holes along a third direction at vacancies of the dielectric structure formed after removing the sacrificial layers, the third, first and second directions being perpendicular; forming transistors and capacitors sequentially in the capacitor via holes based on bit lines, the capacitors being parallel to the substrate surface; and forming a word line extending in the second direction between two adjacent ones of the transistors.

18 Claims, 16 Drawing Sheets

(56) References Cited

U.S. PATENT DOCUMENTS

| | | | |
|---|---|---|---|
| 2019/0164985 A1* | 5/2019 | Lee | ........................ H10D 1/714 |
| 2020/0212041 A1 | 7/2020 | Machkaoutsan | |
| 2021/0012828 A1 | 1/2021 | Kim et al. | |
| 2021/0013210 A1* | 1/2021 | Lee | ........................ H10B 12/50 |
| 2021/0159229 A1 | 5/2021 | Gomes et al. | |
| 2021/0249415 A1 | 8/2021 | Kang et al. | |
| 2021/0257366 A1* | 8/2021 | Lee | ........................ H10B 12/50 |
| 2022/0068931 A1 | 3/2022 | Gomes et al. | |

FOREIGN PATENT DOCUMENTS

| | | |
|---|---|---|
| CN | 112216318 A | 1/2021 |
| CN | 112216696 A | 1/2021 |
| CN | 112510044 A | 3/2021 |
| CN | 113366637 A | 9/2021 |
| CN | 113889473 A | 1/2022 |
| CN | 114023703 A | 2/2022 |
| EP | 3826058 A1 | 5/2021 |

OTHER PUBLICATIONS

Second Office Action of the Chinese application No. 202210013802.0, issued on Mar. 11, 2022.
Notice of Allowance of the Chinese application No. 202210013802.0, issued on Apr. 1, 2022.
Extended European Search Report in application No. 22918042, mailed on Aug. 21, 2024.

* cited by examiner

METHOD FOR FORMING SEMICONDUCTOR DEVICE AND SEMICONDUCTOR DEVICE

CROSS-REFERENCE TO RELATED APPLICATIONS

This is a continuation of International Application No. PCT/CN2022/081165 filed on Mar. 16, 2022, which claims priority to Chinese Patent Application No. 202210013802.0 filed on Jan. 7, 2022. The disclosures of the above applications are hereby incorporated by reference in their entirety.

BACKGROUND

With the development of semiconductor industry, the critical dimensions of Dynamic Random Access Memory (DRAM) devices are decreasing.

However, with the limitation of etching resolution in semiconductor manufacturing process, when semiconductor devices are formed by related technologies, the critical dimensions of semiconductor devices cannot be infinitely reduced. Therefore, how to realize stacking of semiconductor device is an urgent problem to be solved in the semiconductor field.

SUMMARY

In view of this, embodiments of the disclosure provide a method for forming a semiconductor device and a semiconductor device.

In a first aspect, the embodiments of the disclosure provide a method for forming a semiconductor device. The method includes following operations.

A substrate and a stacked structure covering the substrate are provided. The stacked structure includes alternately stacked dielectric layers and sacrificial layers.

Multiple isolation layers extending in a first direction and arranged in a second direction are formed in the stacked structure. The first direction is perpendicular to the substrate surface. The second direction is perpendicular to the first direction A bit line is formed between two adjacent ones of the isolation layers. The sacrificial layers are removed.

Capacitor via holes along a third direction is formed in vacancies of a dielectric structure. The dielectric structure is formed after removing the sacrificial layers. The third direction, the first direction and the second direction are perpendicular to each other.

Transistors and capacitors are formed sequentially in capacitor via holes based on bit lines. The capacitors are parallel to the substrate surface.

A word line extending in the second direction is formed between adjacent two transistors to form the semiconductor device.

In a second aspect, the embodiments of the disclosure provide a semiconductor device. The semiconductor device includes a substrate, a dielectric structure, bit lines, transistors, capacitors and word lines.

The dielectric structure includes multiple dielectric layers parallel to the substrate and multiple isolation layers perpendicular to the substrate. A projection of the dielectric structure in a third direction is grid-shaped.

The bit lines are perpendicular to the substrate and located in the dielectric structure.

The transistors are parallel to the substrate, connected to the bit lines, located in vacancies of the dielectric structure and extending in the third direction.

The capacitors are parallel to the substrate, connected to the transistors, located in the dielectric structure and extending in the third direction; and The word lines are parallel to the substrate, located in each of the dielectric layers and extending in a second direction. The second direction is perpendicular to the third direction.

BRIEF DESCRIPTION OF THE DRAWINGS

In the drawings (which are not necessarily drawn to scale), similar reference numbers may describe similar components in different views. Similar reference numbers with different letter suffixes may denote different examples of similar components. The drawings generally illustrate various embodiments discussed herein by way of example and not limitation.

DETAILED DESCRIPTION

Figure 1A:
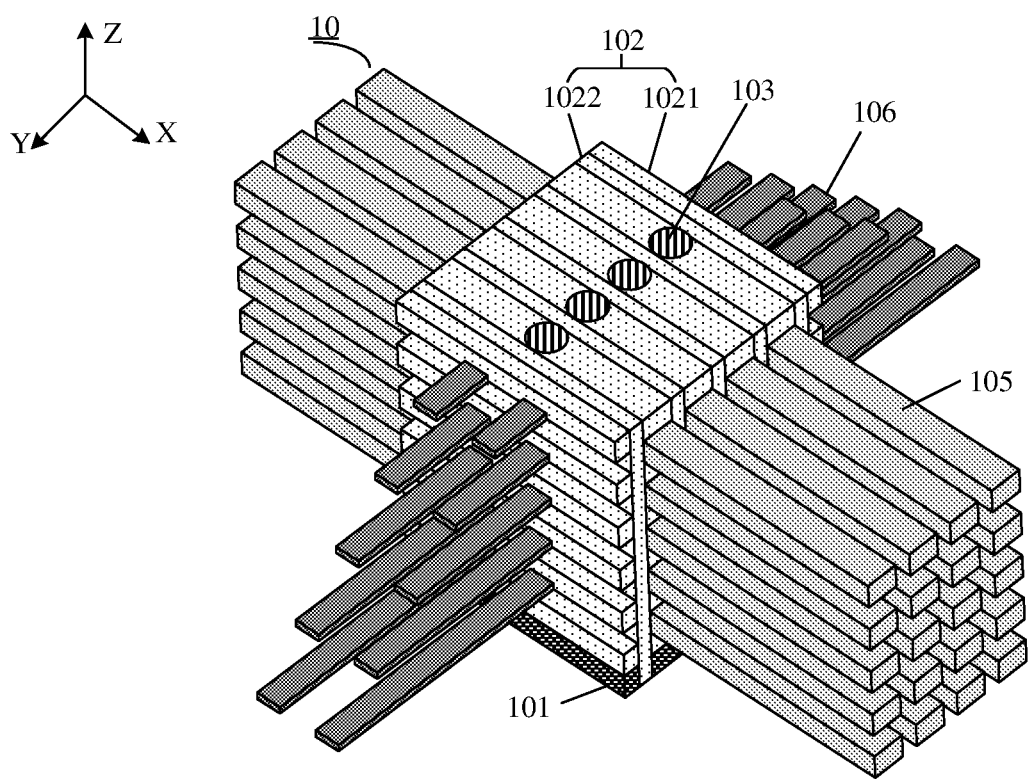
FIG. 1A is a partial structural diagram of a semiconductor device provided by the embodiments of the disclosure.

The disclosure relates to the technical field of semiconductor, and relates to but is not limited to a method for forming a semiconductor device and a semiconductor device.

In order to make the purpose, technical solutions and advantages of the embodiments of the disclosure clearer, the specific technical solutions of the disclosure will be described in further detail below in conjunction with the accompanying drawings in the embodiments of the disclosure. The following embodiments are used to illustrate the disclosure, but are not intended to limit the scope of the disclosure.

In the following description, numerous specific details are given to provide a more thorough understanding of the disclosure. However it will be apparent to a person skilled in the art that the disclosure may be practiced without one or more of these details. In other examples, some technical features well known in the art are not described in order to avoid confusion with the disclosure; that is, all features of actual embodiments are not described herein, and well-known functions and structures are not described in detail.

In the drawings, the dimensions of layers, regions, elements and their relative dimensions may be exaggerated for clarity. Throughout, the same reference numbers denote the same elements.

It is to be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood, although various elements, components, regions, layers and/or parts may be described with terms first, second, third, etc., these elements, components, regions, layers and/or parts should not be limited by these terms. These terms are used only to distinguish one element, component, area, layer or part from another element, component, area, layer or part. Therefore, a first element, component, region, layer or part discussed below may be represented as a second element, component, region, layer or part without departing from the teaching of the disclosure. A second element, component, region, layer or part does not imply that a first element, component, region, layer or part is necessarily present in the disclosure.

Spatially relational terms such as "below", "under", "lower", "beneath", "above", and "upper" may be used herein for conveniently describing a relationship between one element or feature and another element or feature illustrated in the figures. It is to be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. Moreover, the device may include otherwise orientation (rotation by 90 degrees or in other orientations) and the spatial descriptors used herein may be interpreted accordingly.

The terminology used herein is intended to describe the specific embodiments only and is not to be a limitation of the disclosure. As used herein, singular forms of "a", "an" and "said/the" are also intended to include the plural forms, unless the context clearly indicates otherwise. It should also be understood that the terms "including" and/or "comprising", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Figure 1B:
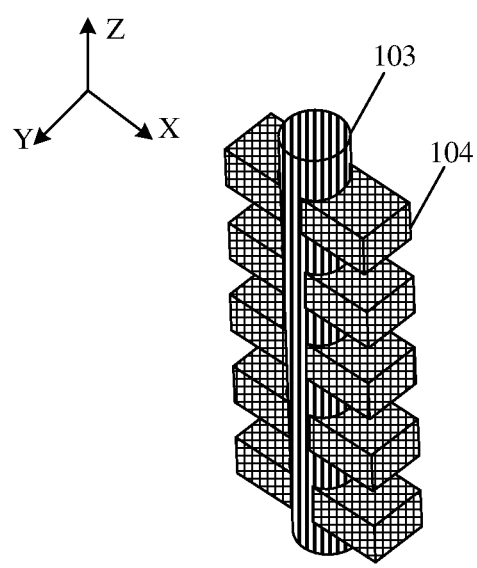
FIG. 1B is a partial structural diagram of a semiconductor device provided by the embodiments of the disclosure.
Figure 1C:
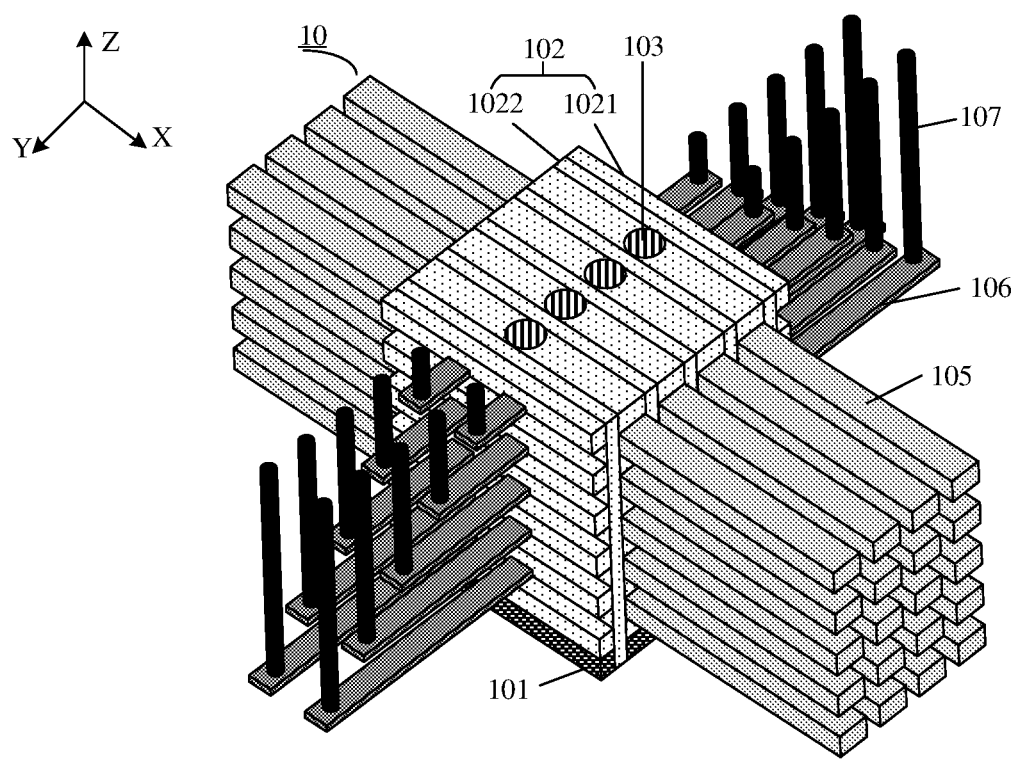
FIG. 1C is a partial structural diagram of a semiconductor device provided by the embodiments of the disclosure.

Based on problems existing in some implementations, the embodiments of the disclosure provide a semiconductor device, as shown in FIGS. 1A and 1B. FIGS. 1A to 1C are partial structural diagrams of a semiconductor device provided by the embodiments of the disclosure. The semiconductor device 10 provided by the embodiments of the disclosure includes a substrate 101, a dielectric structure 102, bit lines 103, transistors 104 (not shown in FIG. 1A), capacitors 105 and word lines 106. The dielectric structure 102 includes multiple dielectric layers 1021 parallel to the substrate 101 and multiple isolation layers 1022 perpendicular to the substrate 101. A projection of the dielectric structure 102 in a third direction is grid-shaped. Bit lines 103 are perpendicular to the substrate 101 and located in the dielectric structure 102. Transistors 104 are parallel to the substrate 101, are connected to bit lines 103, are located in vacancies of the dielectric structure 102, and extend in the third direction as shown in FIG. 1B. Capacitors 105 are parallel to the substrate 101, are connected to the transistors 104, are located in the dielectric structure 102, and extend in the third direction. Word lines 106 are parallel to the substrate 101, are located in each dielectric layer 1021, and extend in a second direction. The second direction is perpendicular to the third direction.

In the embodiments of the disclosure, Z direction is the first direction, Y direction is the second direction, and the X direction is the third direction, as shown in FIG. 1A.

In some embodiments, a semiconductor device 10 provided by the embodiments of the disclosure also includes connection lines 107 for connecting the peripheral circuit and the word lines 106, to enable power supply to the word lines 106, as shown in FIG. 1C.

In the embodiments of the disclosure, by forming multiple isolation layers extending along the first direction and arranged along the second direction, in a stacked structure formed by alternately stacking dielectric layers and sacrificial layers, a bit line is formed between two adjacent ones of the isolation layers, a transistor and a capacitor are formed based on the bit line, the capacitor is parallel to a surface of the substrate, and a word line is formed between two adjacent ones of the transistors, thereby forming a three-dimensional stacked semiconductor device. In this way, in the embodiments of the disclosure, two transistors share a bit line by configuring the bit lines perpendicular to the substrate, and the capacitors are configured to be parallel to the substrate and located on both sides of the bit lines. By doing so, the embodiments of the disclosure can reduce the size of key devices and improve the performance of semiconductor devices by sharing a bit line while realizing three-dimensional stacking.

Figure 2:
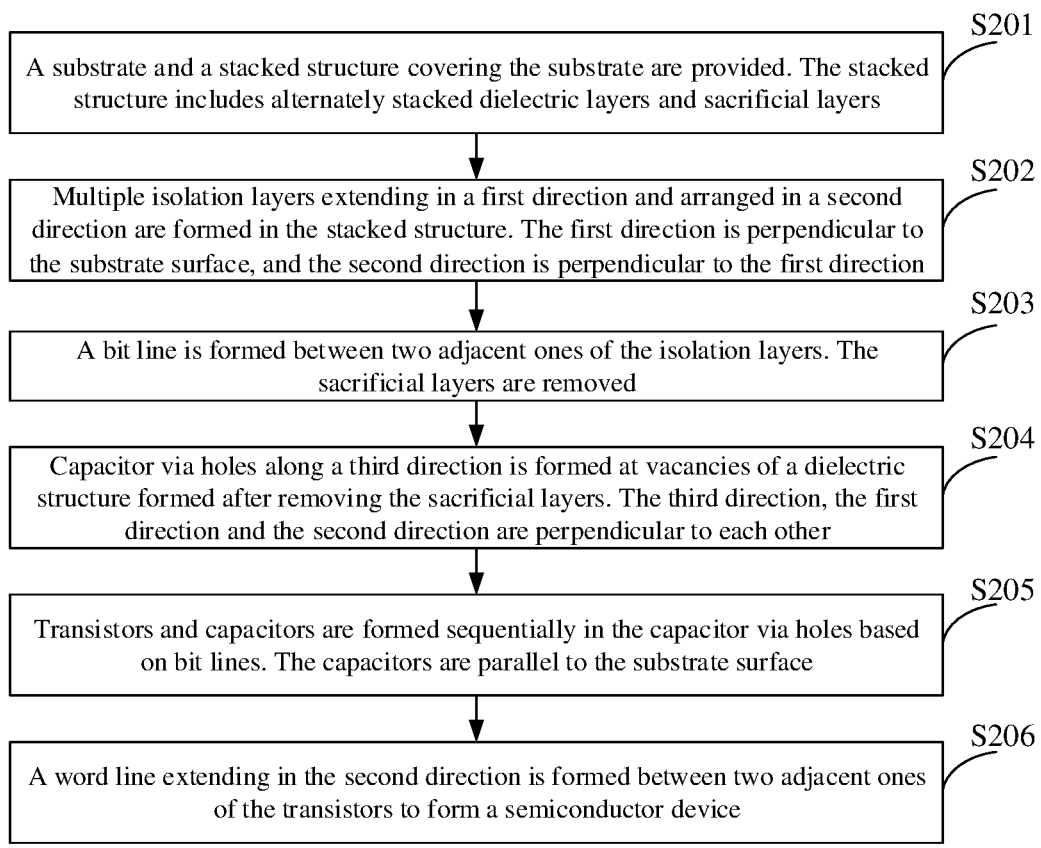
FIG. 2 is a flow diagram of a method for forming a semiconductor device provided by the embodiments of the disclosure.

Based on the semiconductor device provided by the foregoing embodiments, the embodiments of the disclosure further provide a method for forming the semiconductor device. FIG. 2 is a flow diagram of the method for forming the semiconductor device provided by the embodiments of the disclosure. As shown in FIG. 2, the semiconductor device can be formed by the following operations:

S201, a substrate and a stacked structure covering the substrate is provided. The stacked structure includes alternately stacked dielectric layers and sacrificial layers.

S202, multiple isolation layers extending along a first direction and arranged along a second direction are formed in the stacked structure. The first direction is perpendicular to a surface of the substrate. The second direction is perpendicular to the first direction.

S203, a bit line is formed between two adjacent ones of the isolation layers. The sacrificial layers are removed.

S204, capacitor via holes are formed along a third direction at vacancies of the dielectric structure formed after removing the sacrificial layers. The third direction, the first direction and the second direction are perpendicular to each other.

S205, based on the bit lines, transistors and capacitors are sequentially formed in the capacitor via holes. The capacitors are parallel to the surface of the substrate.

S206, a word line extending in the second direction is formed between two adjacent ones of the transistors to form the semiconductor device.

Next, the method for forming the semiconductor device provided by the embodiments of the disclosure will be further described in detail with reference to FIGS. 3A to 3L which are partial structural diagrams corresponding to the method for forming the semiconductor device provided by the embodiments of the disclosure.

Figure 3A:
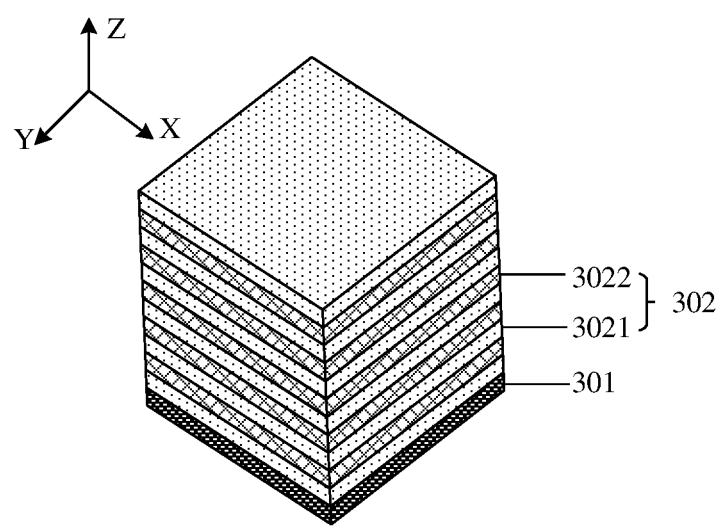
FIG. 3A is a partial structural diagram corresponding to the method for forming the semiconductor device provided by the embodiments of the disclosure.

As shown in FIG. 3A, S201 is performed to provide a substrate 301 and a stacked structure 302 covering the substrate 301. The stacked structure 302 includes alternately stacked dielectric layers 3021 and sacrificial layers 3022.

In some embodiments, the substrate 301 may be a silicon substrate, a silicon nitride substrate or a gallium nitride substrate. The dielectric layers 3021 may be of nitride such as silicon nitride, silicon carbonitride or silicon boron nitride, and the sacrificial layer 3022 may be of oxide such as silicon oxide.

Figure 3B:
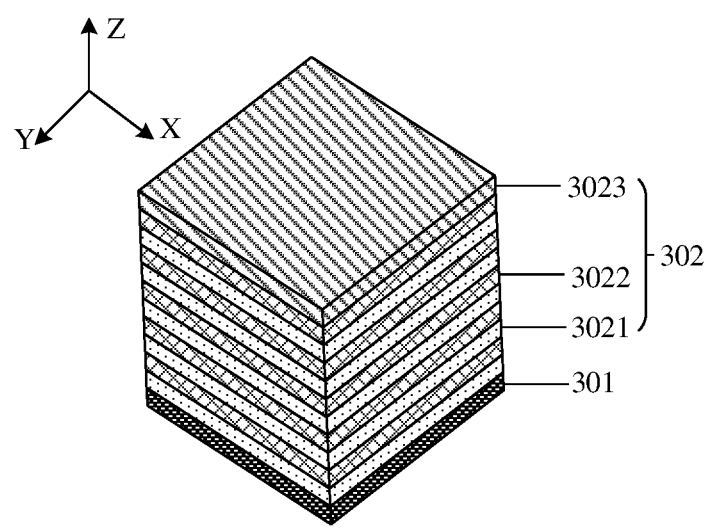
FIG. 3B is a partial structural diagram corresponding to the method for forming the semiconductor device provided by the embodiments of the disclosure.

In some embodiments, as shown in FIG. 3B, after forming the stacked structure 302, an oxide layer 3023 may also be formed on a surface of the stacked structure 302. The oxide layer 3023 represents the end of the stacked structure 302, and the oxide layer 3023 may be of silicon oxynitride.

Figure 3C:
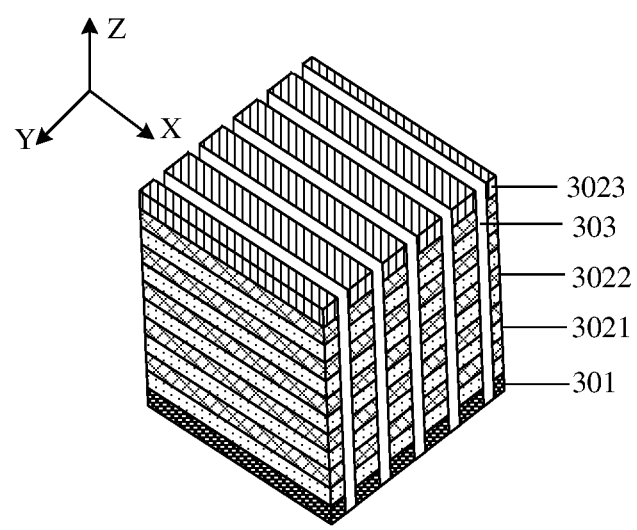
FIG. 3C is a partial structural diagram corresponding to the method for forming the semiconductor device provided by the embodiments of the disclosure.
Figure 3D:
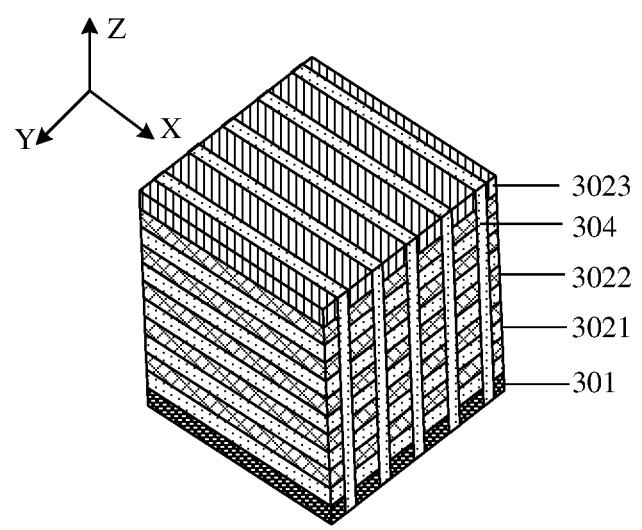
FIG. 3D is a partial structural diagram corresponding to the method for forming the semiconductor device provided by the embodiments of the disclosure.

Next, referring to FIGS. 3C and 3D, S202 is performed. In the embodiments of the disclosure, isolation layers may be formed by the following operations:

S2021, the stacked structure is etched along the first direction to form multiple isolation trenches arranged at equal intervals along the second direction.

S2022, an isolation material is filled in the isolation trenches to form multiple isolation layers arranged at equal intervals along the second direction.

Referring to FIGS. 3C and 3D, multiple isolation trenches 303 arranged at equal intervals along the second direction (that is, the Y direction) may be formed in the stacked structure 302 by wet etching or dry etching, and then multiple isolation layers 304 arranged at equal intervals along the second direction may be formed by filling the isolation trenches 303 with the isolation material by physical vapor deposition (PVD), chemical vapor deposition (CVD) or atomic layer deposition (ALD).

In some embodiments, a material of the isolation layers 304 may be an oxide or a nitride. The material of the isolation layers 304 and the material of the dielectric layers 3021 may be the same or different.

Figure 3E:
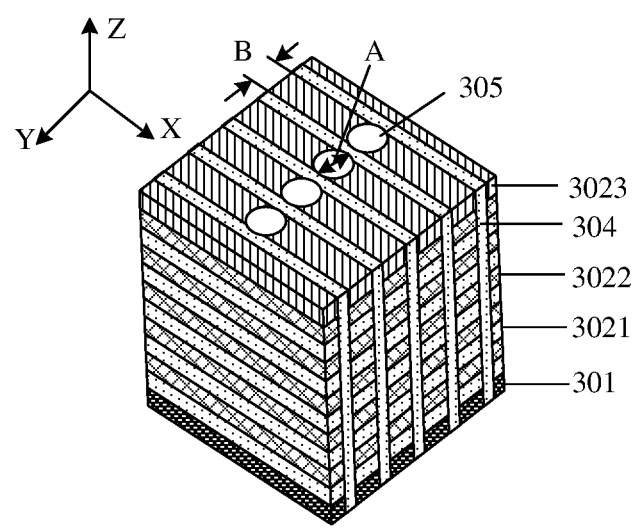
FIG. 3E is a partial structural diagram corresponding to the method for forming the semiconductor device provided by the embodiments of the disclosure.
Figure 3F:
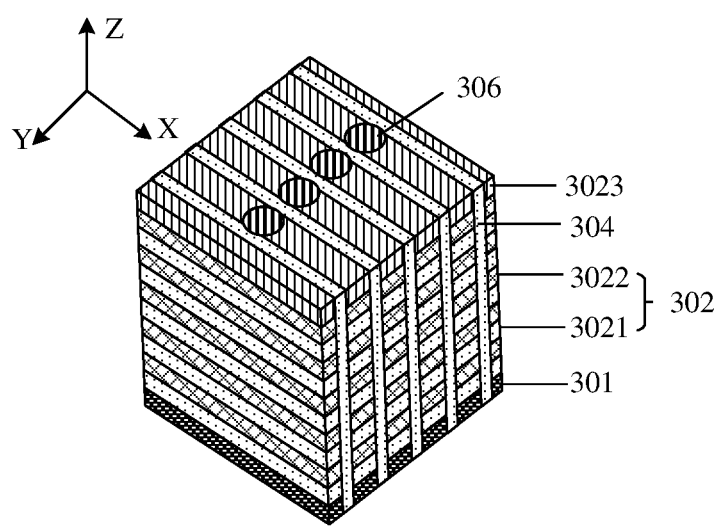
FIG. 3F is a partial structural diagram corresponding to the method for forming the semiconductor device provided by the embodiments of the disclosure.
Figure 3G:
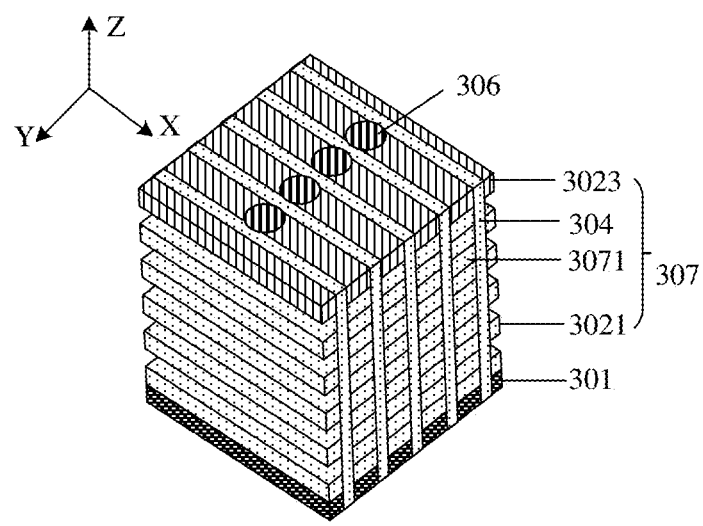
FIG. 3G is a partial structural diagram corresponding to the method for forming the semiconductor device provided by the embodiments of the disclosure.

Next referring to FIGS. 3E to 3G, S203 is performed. A bit line between two adjacent ones of the isolation layers is formed. The sacrificial layers 3022 are removed.

In some embodiments, the operation that a bit line is formed may be accomplished by the following operations:

S2031, a bit line via hole is formed between two adjacent ones of the isolation layers. The diameter of the bit line via hole is greater than or equal to the spacing between two adjacent ones of the isolation layers.

S2032, a bit line is formed in each bit via hole. A top surface of the bit lines is flush with a top surface of the stacked structure in the first direction.

In some embodiments, the stacked structure may be etched along the first direction (that is, the Z direction) between two adjacent ones of the isolation layers 304 by wet etching or dry etching until the substrate 301 is exposed, to form a bit line via 305 correspondingly, as shown in FIG. 3E.

In some embodiments, diameter A of the bit line via holes 305 is greater than or equal to spacing B between two adjacent ones of the isolation layers 304. By doing so, when transistors are subsequently formed on both sides of each bit line along the third direction in the stacked structure, the transistors on both sides are not connected to each other, thereby avoiding a transistor failure.

In some embodiments, after forming the bit line via holes 305, bit lines 306 are formed in bit line via holes 305 by physical vapor deposition, chemical vapor deposition, atomic layer deposition, or epitaxial growth until the top surface of the bit lines 306 is flush with the top surface of the stacked structure, as shown in FIG. 3F.

In the embodiments of the disclosure, where bit lines 306 are formed in bit line via holes 305 by the epitaxial growth, the epitaxial growth can be performed on the basis of the silicon substrate 301, and in-situ doping can be performed during the epitaxial growth process to obtain the bit lines 306. A material of the bit lines 306 include tungsten (W), cobalt (Co), copper (Cu), aluminum (Al), polysilicon, doped silicon, silicide, or any combinations thereof.

In some embodiments, the sacrificial layers 3022 in the stack structure 302 may be removed by wet etching after forming the bit lines 306. The stack structure and the isolation layers 304 form a dielectric structure 307 whose projection in the third direction (that is, the X direction) is grid-shaped Vacancies of the dielectric structure 307 constitute the growth regions for the transistors and capacitors.

Next, S204 is performed. Capacitor via holes 3071 are formed in the vacancies of the dielectric structure 307 along the third direction, as shown in FIG. 3G. The vacancies are formed after the sacrificial layers 3022 are removed. Sidewalls of the vacancies are composed of dielectric layers 3021 and isolation layers 304.

Figure 3H:
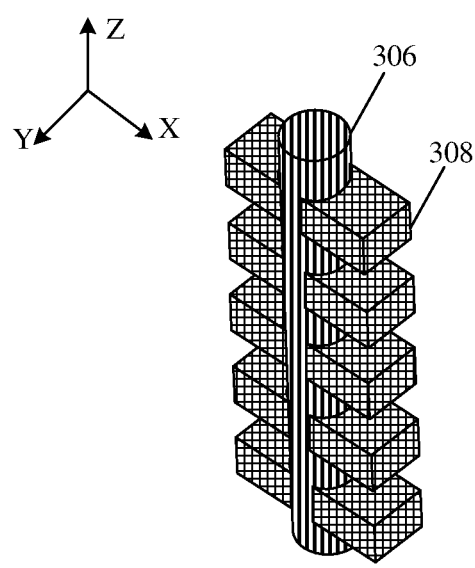
FIG. 3H is a partial structural diagram corresponding to the method for forming the semiconductor device provided by the embodiments of the disclosure.
Figure 3I:
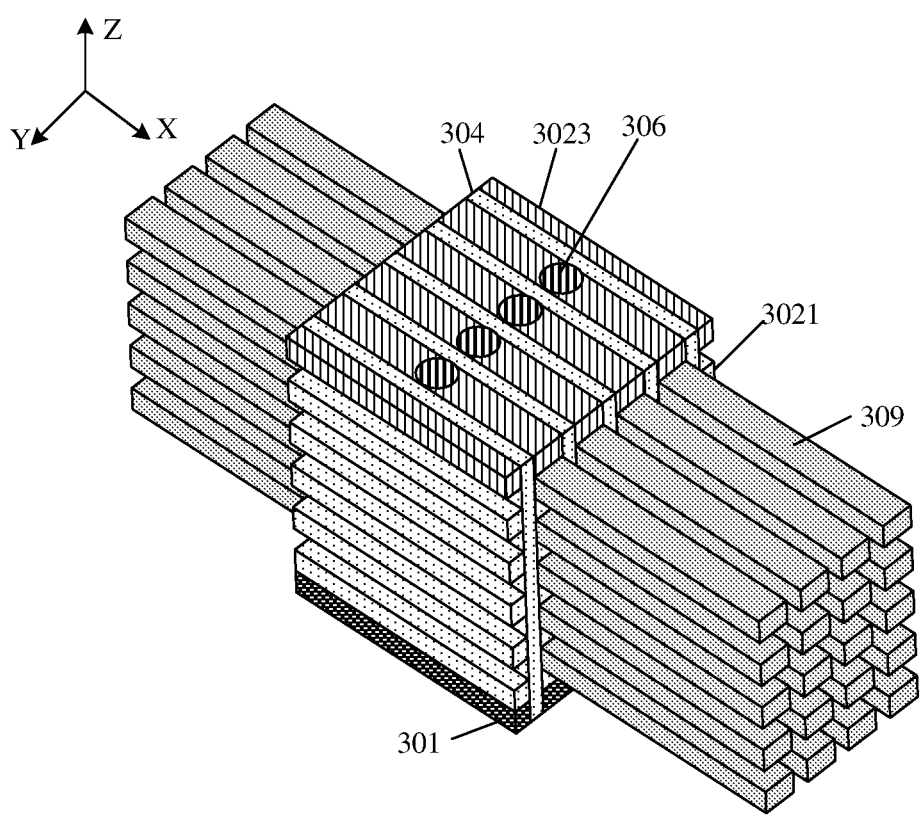
FIG. 3I is a partial structural diagram corresponding to the method for forming the semiconductor device provided by the embodiments of the disclosure.

Referring to FIGS. 3H and 3I, S205 is performed. Transistors 308 and capacitors 309 are sequentially formed in capacitor via holes may be performed by the following operations:

S2051, in the third direction, based on the bit lines, the transistors are formed in the capacitor via holes by an epitaxial growth process. Sources of the transistors are connected with the bit lines.

Referring to FIG. 3H, the transistors 308 are formed in the capacitor via holes based on the bit lines 306, the stacked structure is omitted and only the bit lines 306 and the transistors 308 are shown in FIG. 3H. In the embodiments of the disclosure the transistors 308 connected to the bit lines may be formed in the capacitor via holes by physical vapor deposition, chemical vapor deposition, atomic layer deposition or epitaxial growth. Where transistor 308 is formed by epitaxial growth, in-situ doping may be performed during epitaxial growth to form transistors 308.

In the embodiments of the disclosure, after the transistors 308 are formed, sources or drains of the transistors 308 contact the bit lines 306, which are not shown in the embodiments of the disclosure and the drawings.

As shown in FIG. 3H, in the embodiments of the disclosure, transistors are formed on both sides of a bit line. A semiconductor device structure in which multiple transistors share a bit line reduces the size of the semiconductor device and improves the performance of the semiconductor device.

S2052, a first electrode layer is formed on inner walls of capacitor via holes and surfaces of transistors in the third direction.

S2053, a capacitor dielectric layer covering the first electrode layer and a second electrode layer covering the capacitor dielectric layer are sequentially formed, to form a capacitor.

Next, referring to FIG. 3I, after forming the transistors 308, the first electrode layer (not shown in the figure) is formed on surfaces of the transistors 308 at the capacitor via holes. The capacitor dielectric layer (not shown in the figure) covering the first electrode layer and the second electrode layer (not shown in the figure) covering the capacitor dielectric layer are formed to form the capacitors 309.

In the embodiments of the disclosure, where sources of the transistors 308 are connected to the bit lines 306, the first electrode layer of capacitors is connected to drains of the transistors 308. When drains of transistors 308 are connected to the bit lines 306, the first electrode layer of capacitors is connected to the sources of the transistor 308.

In the embodiments of the disclosure, a material of the first electrode layer includes a metal nitride or a metal silicide. A material of the second electrode layer includes metal nitride or metal silicide. A material of the capacitor dielectric layer includes at least one of zirconium oxide, hafnium oxide, titanium zirconium oxide, ruthenium oxide, antimony oxide or aluminium oxide.

In the embodiments of the disclosure, based on the bit lines perpendicular to the substrate, the capacitors parallel to the substrate and located on both sides of the bit lines are formed, so that the capacitors can be infinitely superimposed in the direction perpendicular to the substrate, thereby improving the storage performance of semiconductor devices.

Figure 3J:
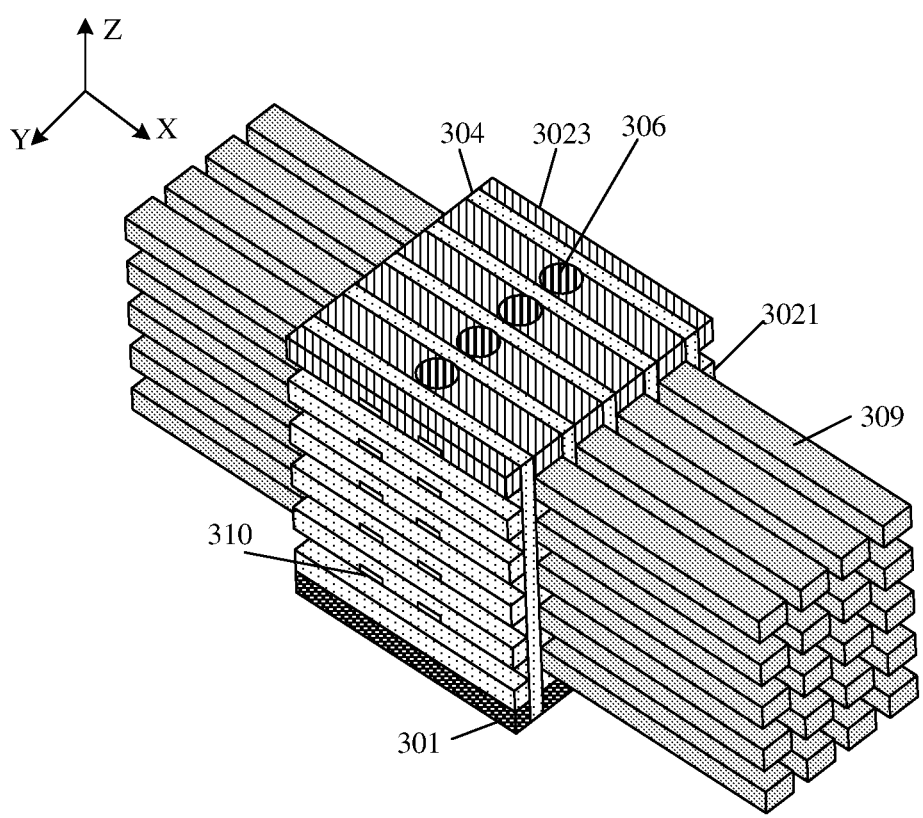
FIG. 3J is a partial structural diagram corresponding to the method for forming the semiconductor device provided by the embodiments of the disclosure.
Figure 3K:
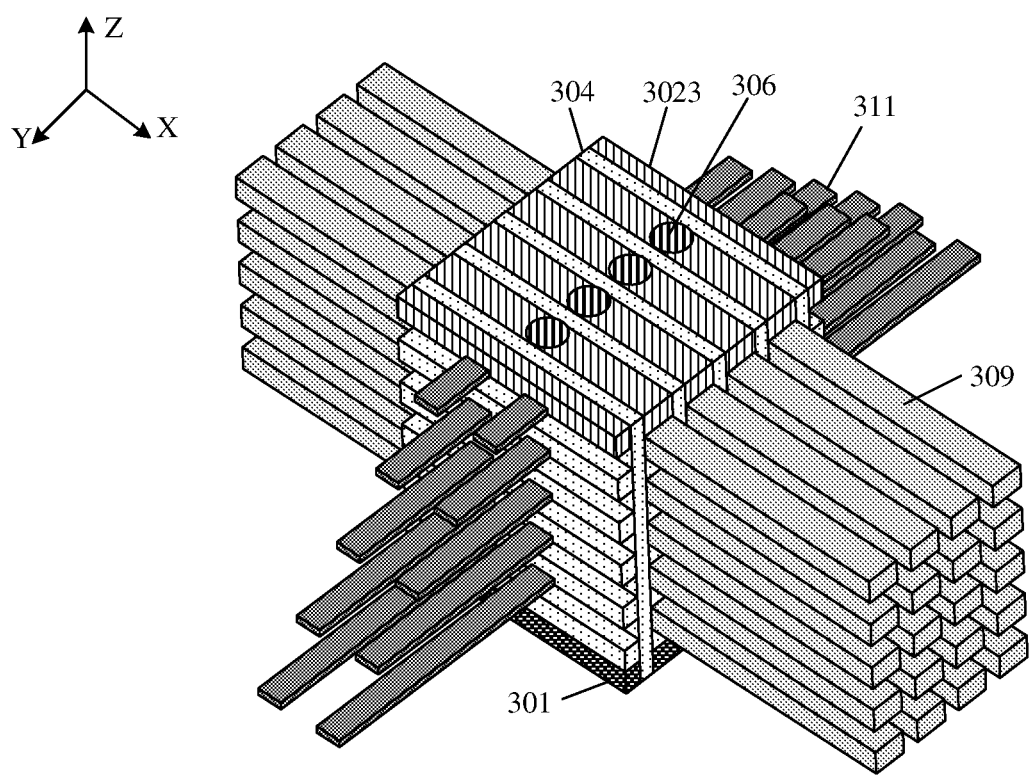
FIG. 3K is a partial structural diagram corresponding to the method for forming the semiconductor device provided by the embodiments of the disclosure.
Figure 3L:
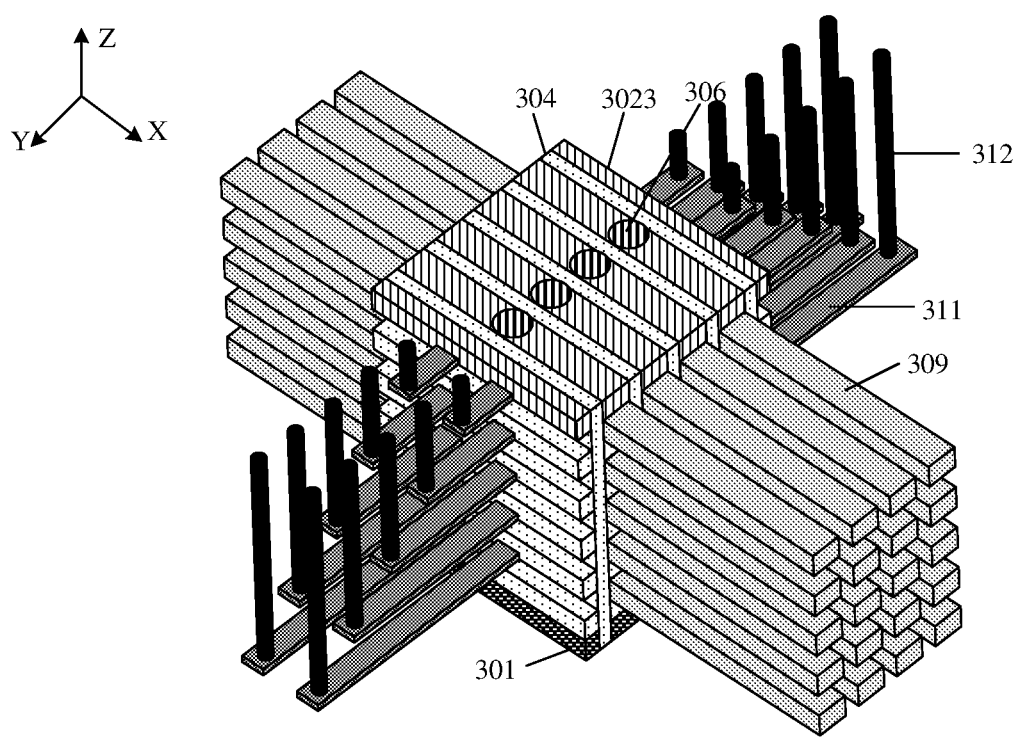
FIG. 3L is a partial structural diagram corresponding to the method for forming the semiconductor device provided by the embodiments of the disclosure.

Next, referring to FIGS. 3J and 3L, S206 is performed. A word line extending in the second direction is formed between two adjacent ones of the transistors 308. In some embodiments, the word lines are connected to the gates of the transistors 308. In the embodiments of the disclosure, the word lines may be formed by the following operations:

S2061, a word line via hole extending in the second direction is formed in each dielectric layer at a position between two adjacent ones of the transistors.

The figures given in the embodiments of the disclosure are all partial schematic diagrams of semiconductor devices. In addition to the structures given in the figures, the dielectric structure still exists or there is an isolation layer outside the dielectric structure 302. These structures are not shown in the figures provided in the embodiments of the disclosure.

Referring to FIG. 3J, word line via holes 310 extending in the second direction (that is, the Y direction) are formed on both sides of the bit lines 306 by dry etching or wet etching at positions between two adjacent ones of the transistors 308 (not shown in the figure) in each dielectric layer 3021 of the dielectric structure. The word line via holes 310 expose the gates of the transistors 308 (not shown in the figure).

S2062, in the first direction, a gate oxide layer covering a bottom surface of each word line via hole is formed.

In some embodiments, before the word lines are formed, a gate oxide layer (not shown in the figure) is formed on the gate surface by physical vapor deposition, chemical vapor deposition, atomic layer deposition, or epitaxial growth at positions where the gates are exposed in the word line via holes 310. The gate oxide layer may be of a material such as silicon dioxide.

S2063, each of the word line via holes with a gate oxide layer is filled, to form a first initial word line. There is a dielectric layer having a first thickness between an initial word line and one of the adjacent bit lines in the third direction.

In the embodiments of the disclosure, the first initial word line may be formed in each word line via hole having the gate oxide layer by physical vapor deposition, chemical vapor deposition, atomic layer deposition or epitaxial growth. There is a dielectric layer (not shown in the figure) of the first thickness C between a first initial word line and one of the adjacent bit lines 306. In order to show the positional relationship between the first initial word lines and the transistors, the dielectric structure is omitted in FIG. 3K, so that the dielectric layers between the first initial word lines and the bit lines 306 are not shown in the figure.

S2064, each first initial word line is etched back to form a word line combination. Both ends of the word line combination are step-shaped in the first direction. The word line combination includes at least two word lines.

In the embodiments of the disclosure, the first initial word lines are not shown in FIG. 3K. At positions not shown in the drawings of the embodiments of the disclosure, the first initial word lines extend in the second direction to a position where the bit lines 306 are not formed.

In some embodiments, in order to realize a connection between each word line and a peripheral circuit, it is necessary to form a connection line to connect the word line and the peripheral circuit. Therefore, in the embodiments of the disclosure, at both ends of each first initial word line, the first initial word line is etched back at least once, so as to form a word line combination. Both ends of the word line combination are step-shaped in the first direction. The word line combination includes at least two word lines 311, as shown in FIG. 3K.

In some embodiments, the operation that the word lines 311 are formed may also be performed by the following operations:

S2065, a word line via hole extending in the second direction is formed in each dielectric layer at a position between two adjacent ones of the transistors.

S2066, in the first direction, a gate oxide layer covering a lower surface of each word line via hole is formed.

S2067, each word line via hole having the gate oxide layer is filled with a first filling material to a partial depth. Multiple word line via holes with remaining depth form multiple stepped word line via holes. Ends of multiple stepped word line via hole at one end along the first direction are arranged in a stepped shape.

S2068, each stepped word line via hole is filled to form a second initial word line combination with one end arranged in a stepped shape. The second initial word line combination includes at least two second initial word lines.

S2069, each second initial word line is etched back to form a word line combination. Both ends of the word line combination are step-shaped in the first direction. The word line combination includes at least two word lines.

In the embodiment of the disclosure, after forming word line via holes extending along the second direction, the word line via holes may be filled to form stepped word line via holes with stepped shaped ends at one side, a second initial word line combination is formed by filling, at this point, one side of the second initial word line combination is stepped shaped and the other side is flush with the opening of the word line via holes, then the flush side of the second initial word line combination is etched back to form a word line combination with both ends along the first direction arranged in a stepped shape to form stepped word lines.

In some embodiments, a material of word lines 311 includes tungsten (W), cobalt (Co), copper (Cu), aluminum (Al), polysilicon, doped silicon, silicide, or any combinations thereof.

In some embodiments, after forming the word lines 311, the following operations may also be included:

S10, a second filling material is filled in remaining holes left after etching back. An upper surface of the second filling material is flush with the outer surface of the dielectric structure.

In some embodiments, the remaining holes left after etching back is word line via holes exposed again after the word lines are etched back. The remaining holes are filled with the second filling material until the upper surface of the second filling material is flush with the outer surface of the dielectric structure.

In some embodiments, after forming the word lines 311, in order to connect word lines and a peripheral circuit, it is necessary to form a connection line to connect the word lines and the peripheral circuit. Therefore, the embodiments of the disclosure may also include the following operations:

S20, the dielectric structure is etched along the first direction at positions corresponding to both ends of each word line, to form at least one connecting via hole. Each word line is exposed by the connecting via hole.

S30, each connecting via hole is filled to form a connecting line. Each word line is connected with a connecting line.

In the embodiments of the disclosure, connecting via holes are formed at positions of the dielectric structure corresponding to both ends of each word line, and the connecting via holes expose the surfaces of the word lines. Because the ends of the word lines at both sides are in stepped shape, the connecting via holes are arranged orderly in the dielectric structure.

In some embodiments, after forming the connection via holes, connection via holes are filled to form connection lines 312. Each word line 311 is connected to a connection line 312, as shown in FIG. 3L Part of the dielectric structure is omitted in FIG. 3 in order to clearly show the positional relationship between the connection lines 312 and the word lines 311.

In some embodiments, after the connection lines 312 are formed, the connection between the word lines 311 and the peripheral circuit can be realized through the connection line 312, thereby powering the word lines 311.

In the embodiments of the disclosure, multiple isolation layers, which extend along the first direction and are arranged along the second direction, are formed in a stacked structure formed by alternately stacked dielectric layers and sacrificial layers, one bit line is formed between each adjacent two isolation layers, transistors and capacitors are formed based on the bit lines, the capacitors are parallel to the substrate surface, and a word line is formed between each adjacent two transistors. A three-dimensional stacked semiconductor device is thus formed. In this way, in the embodiments of the disclosure, two transistors share a bit line by configuring the bit lines perpendicular to the substrate, capacitors are configured to be parallel to the substrate and located on both sides of the bit line. By doing so, the embodiments of the disclosure can reduce the size of key devices and improve the performance of semiconductor devices by sharing the bit line while realizing three-dimensional stacking.

In several embodiments provided by the disclosure, it should be understood that the disclosed devices and methods may be implemented in a non-targeted manner. The above-described embodiments about devices are only illustrative, for example, the division of the units is only a logical functional division, which can be implemented in other ways, such as: multiple units or components can be combined, or can be integrated into another system, or some features can be ignored or not performed. In addition, the components shown or discussed are coupled with each other, or directly coupled.

The units described above as separate elements may or may not be physically separated, and the elements displayed as elements may or may not be physical elements, that is, may be located in one place or may be distributed over multiple network elements; part or all of the units can be selected according to actual needs to achieve the purpose of the solutions of the embodiments.

Features disclosed in several method or device embodiments provided in the disclosure can be arbitrarily combined without conflict to obtain new method or device embodiments.

The above-mentioned is only the specific embodiments of the disclosure, but the scope of protection of the disclosure is not limited thereto. Any skilled person familiar with the technical field can easily think of changes or substitutions within the technical scope of the disclosure, and should be covered within the scope of protection of the disclosure. Therefore, the scope of protection of this disclosure shall be subject to the scope of protection of the claims.

What is claimed is:

1. A method for forming a semiconductor device, comprising:
    providing a substrate and a stacked structure covering the substrate, wherein the stacked structure comprises alternately stacked dielectric layers and sacrificial layers;
    forming a plurality of isolation layers extending in a first direction and arranged in a second direction in the stacked structure, wherein the first direction is perpendicular to a surface of the substrate, and the second direction is perpendicular to the first direction;
    forming a bit line between two adjacent ones of the isolation layers and removing the sacrificial layers, wherein the bit line is formed by epitaxial growth on the substrate;
    forming a dielectric structure after removing the sacrificial layers;
    forming capacitor via holes along a third direction in the dielectric structure, wherein the third direction, the first direction and the second direction are perpendicular to each other;
    forming transistors and capacitors sequentially in the capacitor via holes based on bit lines, wherein the transistors are formed by epitaxial growth on the bit lines, the capacitors are parallel to the surface of the substrate; and
    forming a word line extending in the second direction between two adjacent ones of the transistors to form the semiconductor device.

2. The method according to claim 1, wherein the forming a plurality of isolation layers extending in a first direction and arranged in a second direction in the stacked structure comprises:
- etching the stacked structure along the first direction to form a plurality of isolation trenches arranged at an equal interval along the second direction; and
- filling the isolation trenches with an isolation material to form the plurality of isolation layers arranged at an equal interval along the second direction.

3. The method according to claim 1, wherein the dielectric structure is formed after removing the sacrificial layers;
- wherein a projection of the dielectric structure in the third direction is grid-shaped, and the dielectric structure provides growth regions for the transistors and the capacitors.

4. The method according to claim 1, wherein the forming a bit line between two adjacent ones of the isolation layers comprises:
- forming a bit line via hole between two adjacent ones of the isolation layers, wherein a diameter of the bit line via hole is greater than or equal to an interval between two adjacent ones of the isolation layers; and
- forming the bit line in the bit line via hole, wherein a top surface of the bit line is flush with a top surface of the stacked structure in the first direction.

5. The method according to claim 4, wherein the forming a bit line via hole between two adjacent ones of the isolation layers comprises:
- etching the stacked structure along the first direction between two adjacent ones of the isolation layers until the substrate is exposed, to correspondingly form the bit line via hole.

6. The method according to claim 1, wherein the forming transistors and capacitors sequentially in the capacitor via holes based on bit lines comprises:
- forming the transistors in the capacitor via holes in the third direction by an epitaxial growth process based on the bit lines, sources of the transistors being connected with the bit lines;
- forming first electrode layers on inner walls of the capacitor via holes and surfaces of the transistors in the third direction; and
- forming capacitor dielectric layers covering the first electrode layers and second electrode layers covering the capacitor dielectric layers sequentially to form the capacitors.

7. The method according to claim 1, wherein the forming a word line extending in the second direction between two adjacent ones of the transistors comprises:
- forming a word line via hole extending in the second direction in each of the dielectric layers at a position between two adjacent ones of the transistors;
- forming a gate oxide layer covering a lower surface of each of word line via holes in the first direction;
- filling each of the word line via holes having the gate oxide layer to form first initial word lines, wherein a dielectric layer having a first thickness is located between a first initial word line and the bit line in the third direction; and
- etching back each of the first initial word lines to form a word line combination, the word line combination being arranged in a stepped shape at both ends along the first direction, wherein the word line combination comprises at least two word lines.

8. The method according to claim 7, wherein the etching back each of the first initial word lines comprises:
- etching back the first initial word lines at least once at both ends of each of the first initial word lines.

9. The method according to claim 1, wherein the forming a word line extending in the second direction between two adjacent ones of the transistors comprises:
- forming a word line via hole extending in the second direction in each of the dielectric layers at a position between two adjacent ones of the transistors;
- forming a gate oxide layer covering a lower surface of each of word line via holes in the first direction;
- filling each of the word line via holes having the gate oxide layer with a first filling material to a partial depth, wherein a plurality of word line via holes with a remaining depth form a plurality of stepped word line via holes, and the plurality of stepped word line via holes at one end along the first direction are arranged in a stepped shape;
- filling each of the stepped word line via holes to form a second initial word line combination with one end arranged in the stepped shape, wherein the second initial word line combination comprises at least two second initial word lines; and
- etching back each of second initial word lines to form a word line combination with both ends along the first direction arranged in the stepped shape, wherein the word line combination comprises the at least two word lines.

10. The method according to claim 7, wherein after the forming a word line, the method further comprises:
- filling a second filling material in remaining holes left after etching back, wherein an upper surface of the second filling material and an outer surface of the dielectric structure are flush.

11. The method according to claim 9, wherein after the forming a word line, the method further comprises:
- filling a second filling material in remaining holes left after etching back, wherein an upper surface of the second filling material and an outer surface of the dielectric structure are flush.

12. The method according to claim 1, wherein after the forming a word line, the method further comprises:
- etching the dielectric structure along the first direction at positions corresponding to both ends of each of word lines to form at least one connecting via hole, the connecting via hole exposing a corresponding word line; and
- filling connecting via holes to form connecting lines, and each of the word lines being connected with two connecting lines.

13. The method according to claim 1, wherein after providing the stacked structure, the method further comprises:
- forming an oxide layer covering the stacked structure, the oxide layer being connected to an uppermost sacrificial layer in the stacked structure;
- correspondingly, wherein the forming a plurality of isolation layers extending in a first direction and arranged in a second direction in the stacked structure comprises:
- forming the plurality of isolation layers extending in the first direction and arranged at the equal interval in the second direction in the stacked structure and the oxide layer.

14. A semiconductor device, comprising:
- a substrate;
- a dielectric structure, comprising a plurality of dielectric layers parallel to the substrate and a plurality of isolation layers perpendicular to the substrate, a projection of the dielectric structure in a third direction being grid-shaped;

bit lines perpendicular to the substrate, located in the dielectric structure, wherein the bit lines are formed by epitaxial growth on the substrate;

transistors parallel to the substrate, connected to the bit lines, located in the dielectric structure and extending in the third direction, wherein the transistors are formed by epitaxial growth on the bit lines;

capacitors parallel to the substrate, connected to the transistors, located in the dielectric structure and extending in the third direction; and word lines parallel to the substrate, located in each of the dielectric layers and extending in a second direction, wherein the second direction is perpendicular to the third direction.

15. The semiconductor device according to claim 14, wherein the capacitors comprise at least:

first electrode layers in contact with the transistors and located in the dielectric structure;

capacitor dielectric layers covering surfaces of the first electrode layers; and second electrode layers covering surfaces of the capacitor dielectric layers.

16. The semiconductor device according to claim 14, wherein both ends of a word line combination are step-shaped, and the word line combination is formed by at least two word lines.

17. The semiconductor device according to claim 14, wherein in the dielectric structure, a bit line is connected to a transistor at both sides along the third direction.

18. The semiconductor device according to claim 14, wherein the semiconductor device further comprises:

connecting lines, used for connecting a peripheral circuit and the word lines to power the word lines.

* * * * *